США009183911B2

(12) United States Patent
Alam et al.

(10) Patent No.: US 9,183,911 B2
(45) Date of Patent: Nov. 10, 2015

(54) HYBRID READ SCHEME FOR SPIN TORQUE MRAM

(71) Applicant: Everspin Technologies, Inc., Chandler, AZ (US)

(72) Inventors: Syed M. Alam, Austin, TX (US); Thomas Andre, Austin, TX (US); Chitra Subramanian, Mahopac, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 497 days.

(21) Appl. No.: 13/633,479

(22) Filed: Oct. 2, 2012

(65) Prior Publication Data

US 2013/0128657 A1    May 23, 2013

Related U.S. Application Data

(60) Provisional application No. 61/561,138, filed on Nov. 17, 2011.

(51) Int. Cl.
*G11C 11/00* (2006.01)
*G11C 11/16* (2006.01)
*G11C 13/00* (2006.01)

(52) U.S. Cl.
CPC .......... *G11C 11/1673* (2013.01); *G11C 13/004* (2013.01); *G11C 2013/0057* (2013.01)

(58) Field of Classification Search
CPC ...................................................... G11C 11/00
USPC ......... 365/48, 55, 62, 66, 74, 78, 80–93, 100, 365/129, 130, 131, 148, 158, 171–173, 209, 365/213, 225.5, 230.07, 232, 243.5; 257/295, 421, 422, 427, E21.665, 257/E27.006; 438/3; 977/933–935
See application file for complete search history.

(56) References Cited

U.S. PATENT DOCUMENTS

| 6,052,302 | A | 4/2000 | Moyer et al. |
| 7,057,925 | B2 | 6/2006 | Ooishi et al. |
| 7,876,604 | B2 | 1/2011 | Zheng et al. |
| 2008/0084761 | A1 | 4/2008 | Lee et al. |
| 2008/0238475 | A1 | 10/2008 | Chua-Eoan et al. |
| 2008/0266943 | A1 | 10/2008 | Yang et al. |
| 2009/0323403 | A1 | 12/2009 | Chen et al. |
| 2010/0172173 | A1* | 7/2010 | Abu-Rahma et al. .......... 365/158 |
| 2010/0302690 | A1* | 12/2010 | Worledge ................. 360/324.11 |
| 2010/0320550 | A1* | 12/2010 | Abraham et al. ............. 257/421 |
| 2011/0026317 | A1 | 2/2011 | Zhu et al. |
| 2011/0157971 | A1 | 6/2011 | Kim et al. |
| 2011/0205788 | A1 | 8/2011 | Reed et al. |

OTHER PUBLICATIONS

"Model Study of 1T-1STT-MTJ Memory Arrays for Embedded Applications", IEE MWSCAS 2010, p. 5-8, Raychowdhury.
PCT Search Report and Written Opinion mailed Mar. 8, 2013 in PCT/US12/65852.
The International Bureau of WIPO, International Preliminary Report on Patentability for International Application No. PCT/US2012/065852, mailed May 30, 2014.

* cited by examiner

*Primary Examiner* — Harry W Byrne

(57) ABSTRACT

A method of reading data from a plurality of bits in a spin-torque magnetoresistive memory array includes performing one or more referenced read operations of the bits, and performing a self-referenced read operation, for example, a destructive self-referenced read operation, of any of the bits not successfully read by the referenced read operation. The referenced read operations can be initiated at the same time or prior to that of the destructive self-referenced read operation.

20 Claims, 8 Drawing Sheets

200

300

HYBRID READ SCHEME FOR SPIN TORQUE MRAM

CROSS REFERENCE TO RELATED APPLICATION

This application claims the benefit of U.S. Provisional Application No. 61/561,138 filed 17 Nov. 2011.

TECHNICAL FIELD

The exemplary embodiments described herein generally relate to integrated magnetic devices and more particularly relate to methods for reading magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of the reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bitcell select devices in both current directions can limit the scalability of ST-MRAM.

Data stored in memory is defined in banks. A rank is a plurality of banks in a first direction (column) and a channel is a plurality of banks in a second direction (row). A process for accessing the memory comprises several clock cycles required for row and column identification and a read or write operation. The bandwidth for the data transfer may comprise a row of many thousands of bits.

Access to a bank in a double data rate (DDR) memory generally includes an ACTIVATE operation, followed by several READ/WRITE operations and a PRECHARGE operation. The ACTIVATE operation opens a row (or page) of typically 1,000 or more bits. The READ/WRITE operation performs the reading or writing of columns, e.g., 128 bits, in the open row. The PRECHARGE operation closes the row.

During the ACTIVATE operation, a page of data is read from the memory array and stored in local data-store latches for subsequent READ and WRITE operations from and to the local data-store latches. The ACTIVATE operation can be initiated by an ACTIVATE command or any other command that performs the same operation. During a PRECHARGE operation, the data from local data-store latches are written back to the memory array, and as a result, that page is considered closed or not accessible without a new ACITVATE operation. The PRECHARGE operation can be initiated by a PRECHARGE or AUTO-PRECHARGE command or any other command that performs the same operation.

Referring to FIG. 1, a high ST-MRAM MTJ resistance variation and low magnetoresistance (MR) results in an overlapping distribution of resistances for high state bits 102 and low state bits 104. Known referenced read/sensing schemes using reference bits cannot distinguish high and low states successfully for 100% of the bits. Even if the number of bits in the overlapped region 101 is very low (or even zero), due to low MR and high resistance variation of the high and low state bits, a mid-point reference distribution can overlap with low or high state distributions causing read failure. Self-referenced read that references the bit being read/sensed to itself is known in the prior art to address the aforementioned sensing problem. For example, see U.S. Pat. No. 6,744,663 describing a destructive self-referenced read that requires 100% of the bits being read to be toggled or set to either high or low state during a read operation. The toggle or set to high state or reset to low state operation adds to read power consumption. And U.S. Patent Publication 2009/0323403 describes a non-destructive self-referencing read that does not have the full MR for sensing signal development resulting in a very low sensing signal.

Accordingly, it is desirable to provide a destructive self-referenced read scheme where one or more referenced read operations are completed in parallel or completed first to conditionally block the destructive phase of self-referenced read for bits that can be resolved with a referenced read. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for reading a spin-torque magnetoresistive random access memory.

A first exemplary embodiment is a method of reading data from a plurality of bits in a spin-torque magnetoreistive memory array, the method comprising completing at least one referenced read operation and at least one self-referenced read operation.

A second exemplary embodiment is a method of reading data from a plurality of bits in a spin-torque magnetoreistive memory array, the method comprising performing at least one referenced read operation of the bits to read at least a portion of the bits; and performing a self-referenced read operation of any of the bits not successfully read by the referenced read operation.

A third exemplary embodiment is a circuit for reading data from a plurality of bits in a spin-torque magnetoresistive memory array, the circuit comprising first circuitry coupled to the array and configured to perform a referenced read of the bits; and second circuitry coupled both to the array and the first circuitry, and configured to perform a self-referenced read of the bits.

BRIEF DESCRIPTION OF THE DRAWINGS

The present invention will hereinafter be described in conjunction with the following drawing figures, wherein like numerals denote like elements.

DETAILED DESCRIPTION

Figure 1:
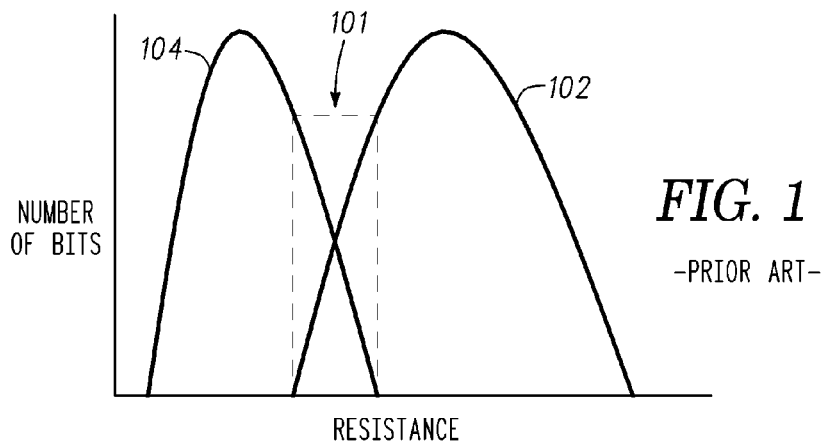
FIG. 1 is a graph of high and low states of the resistance of a number of bits of a known array.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A method of reading data from a plurality of bits in a spin-torque magnetoresistive memory array includes performing one or more referenced read operations of the bits to read at least a portion of the bits, and performing a self-referenced read operation of any of the bits not successfully read by the referenced read operation. The referenced read operations can be initiated at the same time or prior to that of the self-referenced read operation. The self-referenced read operation can further be a destructive self-referenced read. Depending on the output of the referenced read operations, the initiation of the self-referenced read or the just the destructive phase of the destructive self-referenced read is conditionally blocked for the bits whose states can be resolved by the referenced read operations.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to reading and programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through the first magnetic layer in a magnetic/non-magnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided that the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance (MR) is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

Figure 2:
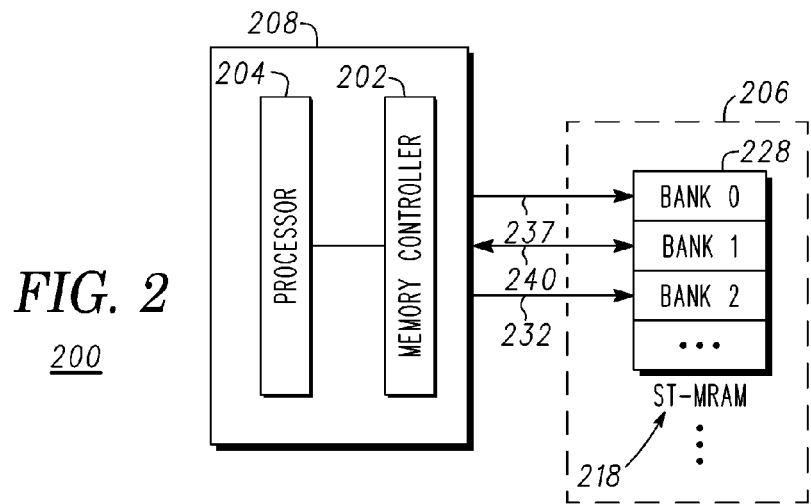
FIG. 2 is a block diagram of a memory interconnection system comprising of a memory controller between a processor and non-volatile memory that may be used to apply the methods in accordance with the exemplary embodiments.

FIG. 2 is a block diagram of an exemplary memory system 200 including a memory controller 202 that performs data transfer between a processor 204 and the memory 206. The memory controller 202 and the processor 204 may reside on the same chip 208, or they may reside on separate chips (not shown). The memory 206 comprises a non-volatile memory 218 using magnetic tunnel junctions, preferably ST-MRAM, for data storage. The non-volatile memory 218 comprises a plurality of non-volatile memory banks 228.

A control signal bus 232 provides control signals, such as chip select, row access strobe, column access strobe, and write enable, from the memory controller 202 to the non-volatile memory 218. An address bus 237 and a data line 240 couples the memory controller 202 to the non-volatile memory 218. Other control and clock signals may exist between the memory controller 202 and non-volatile memory 218 that are not shown in FIG. 2. Furthermore, an address bus 237, a control signal bus 232, and data line 240 may include multiple lines or bits.

In operation, an ACTIVATE operation for an address can be initiated in non-volatile memory 218. Subsequently, the memory controller 202 initiates READ or WRITE operations in the non-volatile memory 218. The data from non-volatile memory 218 is read after the non-volatile memory ACTIVATE operation is complete.

The ACTIVATE operation in DDR ST-MRAM performs a destructive self-referenced read where read data in the memory array is reset to logic state "0" during the read process. The read data from the array is stored in local data-store latches at the completion of the ACTIVATE operation. READ/WRITE operations subsequent to the ACTIVATE operation are performed to the local data-store latches instead of the ST-MRAM array. Small time interval, for e.g. 5 nanoseconds, between READ/WRITE operations is feasible due to fast latch operations.

Figure 3:
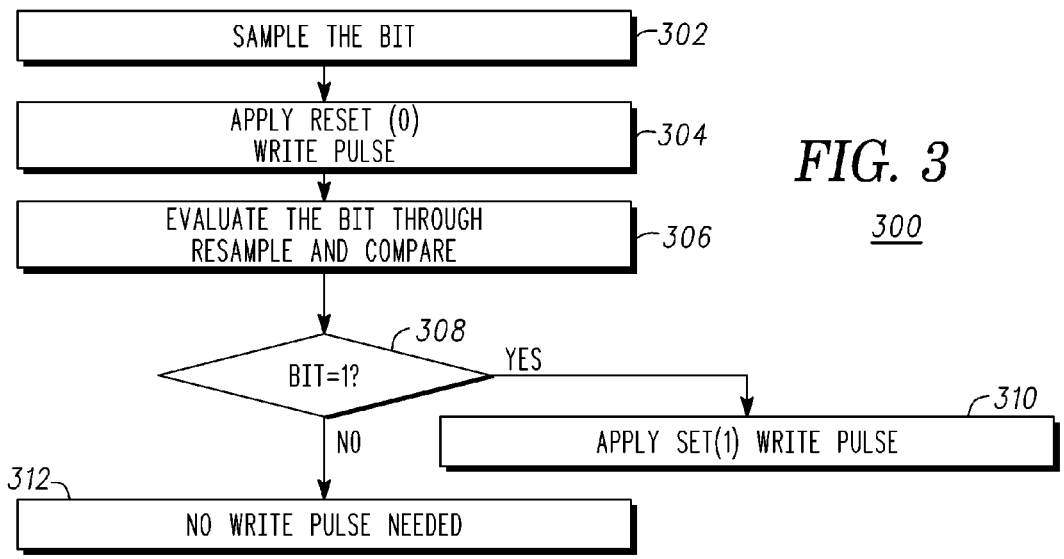
FIG. 3 is a flow chart of the steps for destructive read with write-back in ST-MRAM in accordance with a first exemplary embodiment.

FIG. 3 is a flow chart that illustrates an exemplary embodiment of a destructive self-referenced read operation with an immediate write-back process 300 for restoring read bits of an ST-MRAM memory back to their state prior to the destructive read. For illustrative purposes, the following description of process 300 may refer to elements mentioned above in connection with FIG. 2. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein. Moreover, one or more of the tasks shown in FIG. 3 could be omitted from an embodiment of the process 300 as long as the intended overall functionality remains intact.

This first exemplary embodiment of destructive self-referenced read with immediate write-back in the ST-MRAM array includes first sampling 302 a magnetic bit of the non-volatile memory 218 to provide and store a sampled voltage. An exemplary sample operation is applying a desired voltage, Vbit, across a bit; converting the resulting current through the bit into a voltage, Vsample; and storing Vsample into a capacitor. A reset write current pulse is applied 304 to set the bit to 0 (equivalent to a logic state "0"). The bit state is evaluated 306 by resampling a voltage after step 304 is complete and comparing the resampled voltage with the sampled voltage from step 302. An exemplary resample and evaluate operation is applying the same desired voltage, Vbit, from step 302 across the bit; comparing the resulting current through the bit added with a programmable offset current with the current due to Vsample from step 302 to generate a voltage, Veval; and comparing Veval with Vsample from step 302 to evaluate the bit state. The bit state is thus determined to be either 0 or 1 depending on the sampled voltage levels from 302 and 306. For example, if sampled voltage from 306 is higher than that from step 302, the bit state is 0. The sampled voltage levels can be compared in multiple ways to resolve the bit state. If 308 the bit state is 1, a set write current pulse is applied 310 to set the bit to 1, thus performing an immediate write-back to restore the bit state. If 308 the bit state is not 1, no write pulse is needed 312.

Figure 4:
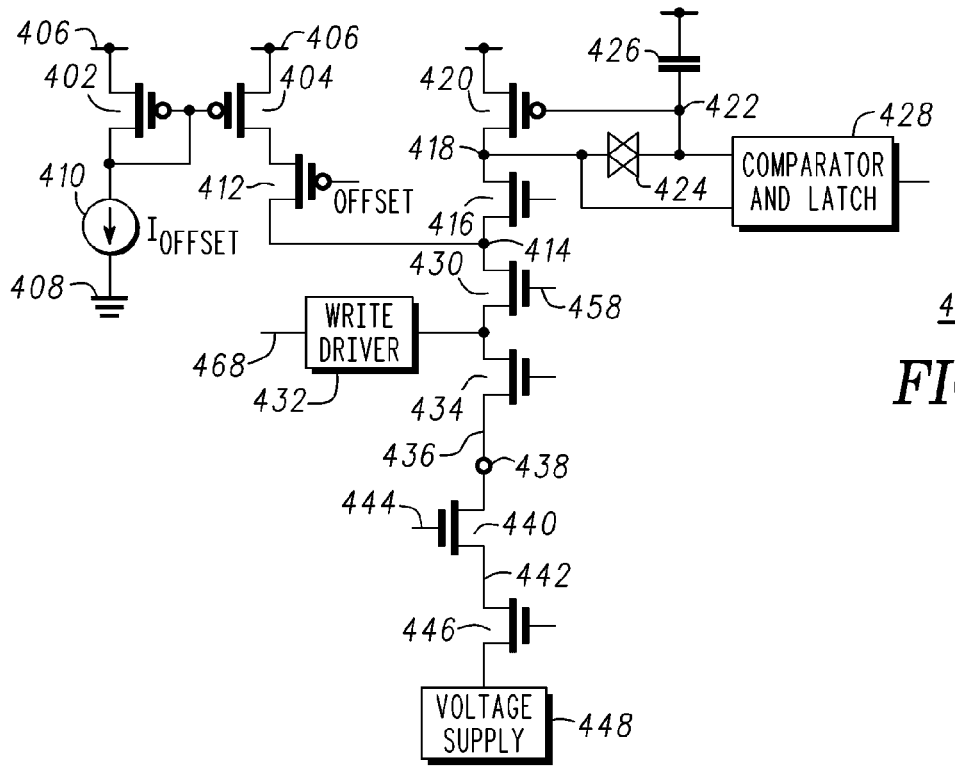
FIG. 4 is a circuit diagram of a destructive self-reference portion of a sense amplifier in accordance with the first exemplary embodiment.

In accordance with FIG. 4, a destructive self-reference portion 400 of a sense amplifier in accordance with a first exemplary embodiment includes first and second mirror transistors 402, 404, each having first current carrying electrodes configured to be connected to a first voltage source 406. The first mirror transistor 402 has a second current carrying electrode connected to control electrodes of the first and second mirror transistors 402, 404, and configured to be coupled to a second voltage source 408 by a current source 410 that provides a current Ioffset. The second mirror transistor 404 has a second current carrying electrode connected to a first current carrying electrode of a switching transistor 412, which has its control electrode configured to receive the current Ioffset and its second current carrying electrode connected to a node 414. The current source 410 is only one example for providing a reference current to the circuit. This current can be provided in multiple other ways, for example, by using an active current mirror instead of the current source.

A switching transistor 416 has a first current carrying electrode connected to a node 418, a second current carrying electrode connected to the node 414, and a control electrode configured to receive an enable signal. A reference transistor 420 has a first current carrying electrode connected to the first reference voltage 406, a second current carrying electrode connected to the node 418, and a control electrode connected to node 422. A transmission gate 424 is coupled between nodes 418 and 422, and a capacitor 426 is coupled between the first reference voltage 406 and node 422. The transmission gate 424 may comprise of one or more enable control inputs that are not shown for simplicity. A comparator and latch 428 has a first input connected to node 422, and a second input connected to node 418. An output of the comparator and latch 428 provides an indication of the bit being in a high or low state.

An nmos-follower transistor 430 has a first current carrying electrode coupled to node 414, a second current carrying electrode connected to both an output of a write driver circuit 432 and a first current carrying electrode of a first column select transistor 434. The control electrode of the transistor 430 is connected to a static voltage line 458. The write driver circuit 432 is configured to receive an enable signal at conductor 468. The first column select transistor 434 has a second current carrying electrode connected to a bit line 436. A selected bit 438 is coupled between the bit line 436 and a first current carrying electrode of the word line transistor 440. The word line transistor 440 has a second current carrying electrode connected to a source line 442 and a control electrode connected to a word line 444. A second column select transistor 446 has a first current carrying electrode connected to the source line 442, and a second current carrying electrode connected to a third reference voltage 448. A control electrode of both the column select transistors 434, 446 is configured to receive a column select signal.

Write driver circuit 432, when enabled by input 468, applies a high voltage at the output node connected to the current carrying electrodes of transistors 430, 434. The circuit can be implemented in multiple ways, for example, by using a transistor with one current carrying electrode connected to 406 and another current carrying electrode connected to the output node.

Figure 5:
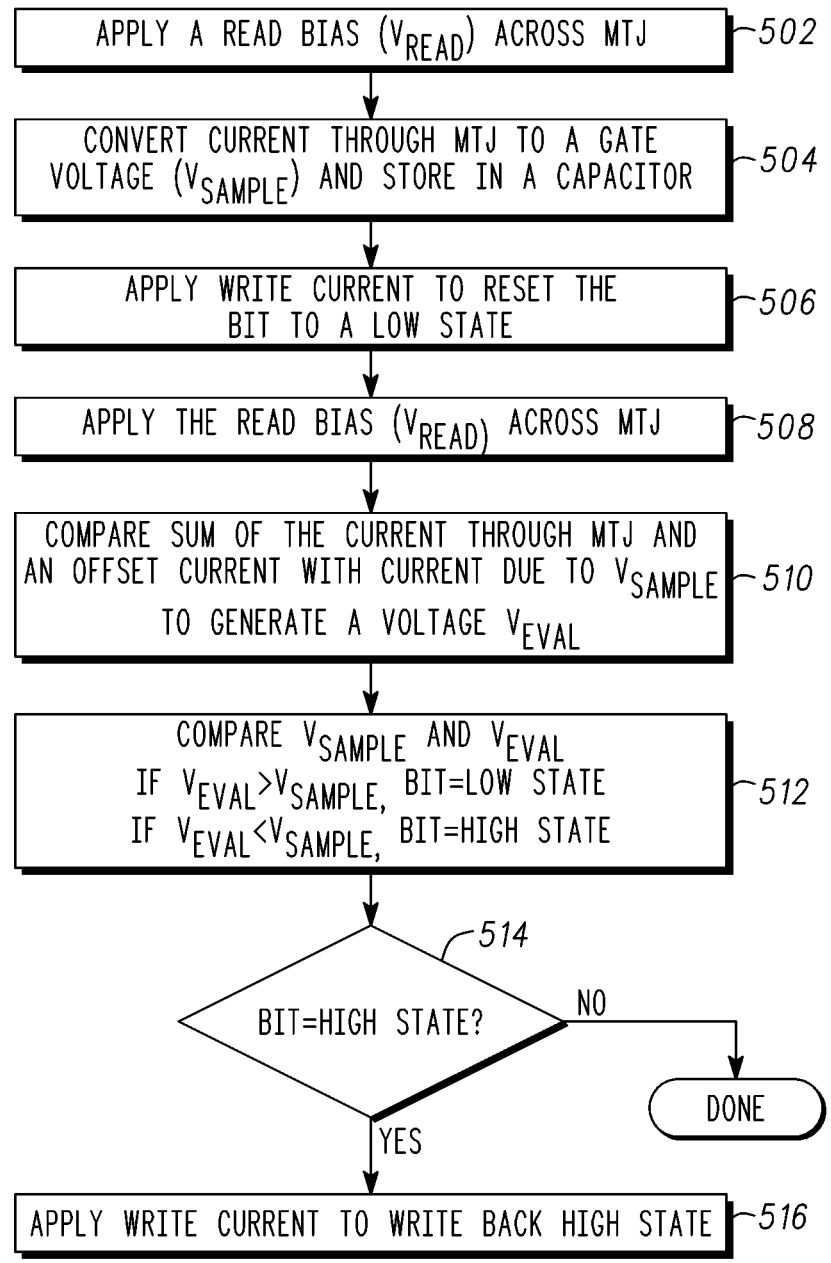
FIG. 5 is a more detailed flow chart of a destructive self-referenced read in accordance with the first exemplary embodiment.

In operation (see FIG. 5), a read bias (Vread) is applied 502 across the bit 438 by enabling transistors 416, 434, 440, and 446. The transmission gate 424 is enabled, thereby connecting node 422 to node 418. The current through the bit 438 is converted 504 to a voltage (Vsample) at node 422 by the transistor 420 and stored in the capacitor 426. At the end of step 504, the transmission gate 424 and transistor 416 are disabled. A write current is applied 506 to reset the bit to a low state (an alternative embodiment could reset the bit to a high state) by the write driver circuit 432. A read bias (Vread) is again applied 508 across the bit 438 by enabling transistor 416. During this step, the transmission gate 424 is disabled, thereby disconnecting node 422 from node 418. The switching transistor 412 is enabled, thereby adding the offset current Ioffset to node 414. An evaluation voltage (Veval) is generated 510 at node 418 by comparing the sum of current through the bit 438 and the offset current Ioffset, mirrored by the transistors 402 and 404 and supplied to node 414 by the transistor 412, to the current through transistor 420 due to the voltage at node 422. Note that the offset current Ioffset applied through transistor 412 is of opposite polarity to the current through the bit 438 applied through transistor 434 and acts to reduce the current applied through transistor 416. The voltages at nodes 418 and 422 are compared 512 by the comparator and latch 428 and bit state is determined as shown in step 512. If the bit is in a high state 514, a write current is applied 516 to the bit 438 to write back the high state.

Figure 6:
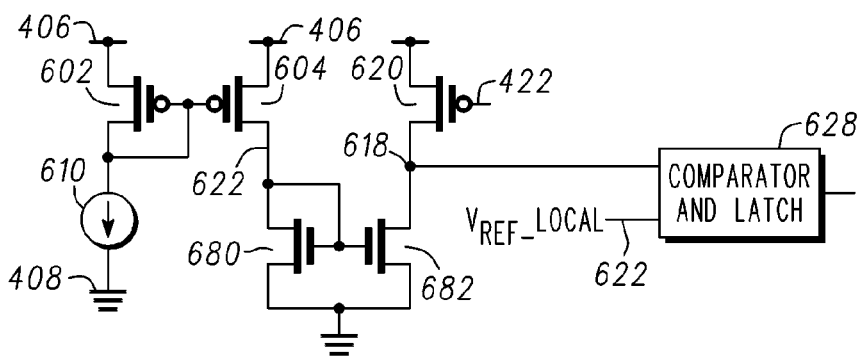
FIG. 6 is a partial schematic view of a parallel referenced read circuit in accordance with a second exemplary embodiment.

One or more referenced read operations can be initiated at the same time or prior to that of the destructive self-referenced read operation 500 performed by the circuit in FIG. 4. FIG. 6 is a partial schematic of a parallel referenced read circuit in accordance with a second exemplary embodiment and includes third and fourth mirror transistors 602, 604, each having first current carrying electrodes configured to be connected to a first voltage source 406. The third mirror transistor 602 has a second current carrying electrode connected to control electrodes of the third and fourth mirror transistors 602, 604, and configured to be coupled to a second voltage source 408 by a current source 610 that provides a current Iref. The current source 610 is only one example of providing a reference current to the circuit. This current may be provided in multiple other ways, for example, by using an active current mirror instead of the current source. This embodiment further includes a transistor 680 having a first current carrying electrode and a control electrode coupled to the current carrying electrode of transistor 604 at node 622, and a second current carrying electrode coupled to the second voltage reference 408. Transistor 682 has a first current carrying electrode coupled to node 618, a second current carrying electrode coupled to the second voltage reference 408, and a control electrode coupled to the current carrying electrode of transistor 604. In this exemplary embodiment, the control electrode of transistor 620 is coupled to receive the sample voltage from node 422 in FIG. 4, and the comparator and latch 628 has a first input connected directly to node 618 and a second input connected to node 622.

In operation, the partial circuit in FIG. 6 compares the voltage at node 618 generated by the sample voltage at node 422 with the voltage at node 622 generated by the reference current Iref, and produces a binary voltage output Vout. Vout is high, or 1, when the voltage at node 618 is higher than that at node 622 and is low, or 0, otherwise. When Iref is equal to Iref_Rloavg, the current through an average low resistance state (logic "0") bit, Vout, is Vout_reflo. When Iref is equal to Iref_Rhiavg, the current through an average high resistance state (logic "1") bit, Vout, is Vout_refhi.

Figure 7:
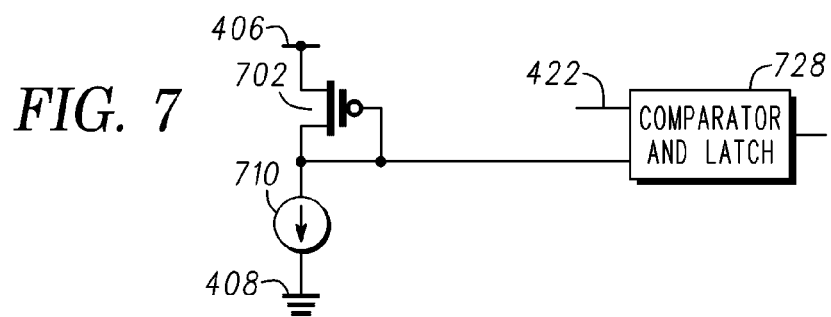
FIG. 7 is a partial schematic view of another parallel referenced read circuit in accordance with a third exemplary embodiment.

FIG. 7 is a partial schematic view of a parallel referenced read circuit in accordance with a third exemplary embodiment and includes a transistor 702 having a first current carrying electrode connected to a first voltage source 406 and a second current carrying electrode connected to control electrode of the transistor 702 and a first input of the comparator and latch 728, and configured to be coupled to the second voltage source 408 by a current source 710 that provides a current Iref. The comparator and latch 628 has a second input coupled to receive the sample voltage from node 422 in FIG. 4. In operation, the partial circuit in FIG. 7 performs the same operation as in FIG. 6, however, implemented with less number of transistors.

In operation (FIG. 8), a read bias is applied 802 across the bit 438 by enabling transistors 416, 434, 440, and 446. The transmission gate 424 is enabled, thereby connecting node 422 to node 418. The current through the bit 438 is converted 804 to a voltage (Vsample) at node 422 by the transistor 420 and stored in the capacitor 426. After step 804, the transmission gate 424 and transistor 416 are disabled. Simultaneous reads of the bit are performed 806, 808 with references to the average low resistance state (logic "0") bit, i.e. Iref=Iref_Rloavg, and to the average high resistance state (logic "1") bit, i.e., Iref=Iref_Rhiavg, respectively. The simultaneous read operations in 806 and 808 can be performed by partial circuits illustrated in FIG. 6 and FIG. 7. If the voltage generated in the read of step 806 is not equal to 1, i.e., Vout_reflo=0, or the voltage generated in the read step 808 is not equal to 0, i.e., Vout_refhi=1 810, and (1) the Vout_reflo and the Vout_refhi are both 1s, the bit being read is a high state (logic "1") bit, or (2) the Vout_refhi and the Vout_reflo are both 0s, the bit being read is a low state bit, step 812. Due to reference levels in steps 806 and 808, if Vout_reflo=0, Vout_refhi must equal 0; therefore, in that case, the bit is in the low state. On the other hand, if Vout_refhi=1, Vout_reflo must equal 1; and therefore, the bit is in the high state in that case. However, in step 810, the voltage generated in the read of step 806 is equal to 1, i.e., Vout_reflo=1, and the voltage generated in the read step 808 is equal to zero, i.e., Vout_refhi=0, a write current is applied 814 to reset the bit to a low state (an alternative embodiment could reset the bit to a high state) by the write driver circuit 432. A read bias is again applied 816 across the bit 438 by enabling transistor 416. During this step, the transmission gate 424 is disabled, thereby disconnecting node 422 from node 418. The switching transistor 412 is enabled, thereby adding the offset current Ioffset to node 414. An evaluation voltage (Veval) is generated 818 at node 418 by comparing the sum of current through the bit 438 and the offset current Ioffset, mirrored by the transistors 402 and 404 and supplied to node 414 by the transistor 412, to the current through transistor 420 due to the voltage at node 422. Note that the offset current Ioffset applied through transistor 412 is of opposite polarity to the current through the bit 438 applied through transistor 434 and acts to reduce the current applied through transistor 416. The voltages at nodes 418 and 422 are compared 820 by the comparator and latch 428 and bit state is determined as shown in step 820. If the bit is not in a low state 822, a write current is applied 824 to the bit 438 to write back the high state. If the bit is in a low state 822, the process 800 completes.

Figure 8A:
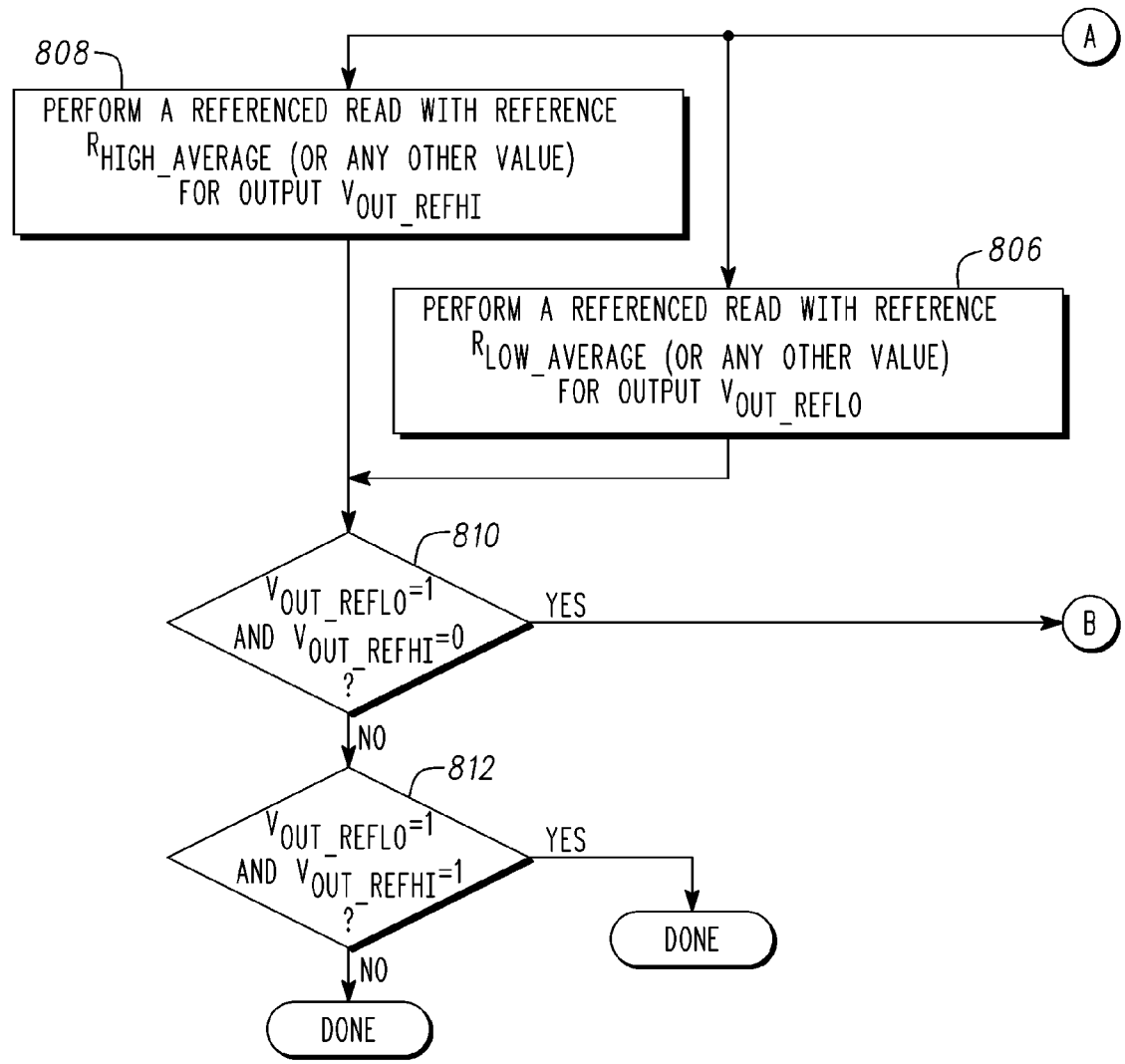
FIG. 8A is a partial flow chart of the full hybrid read scheme in according with a fourth exemplary embodiment.
Figure 8B:
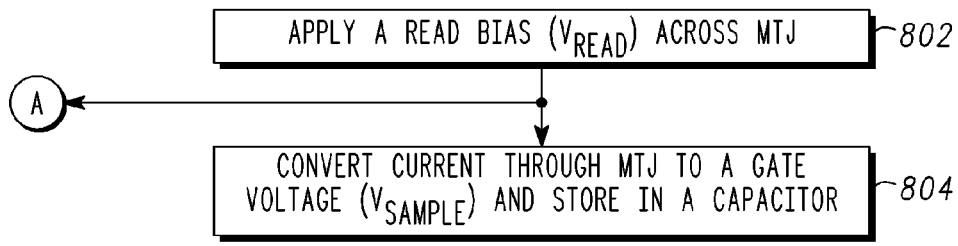
FIG. 8B is a continuation of the partial flow chart of FIG. 8A.
Figure 8C:
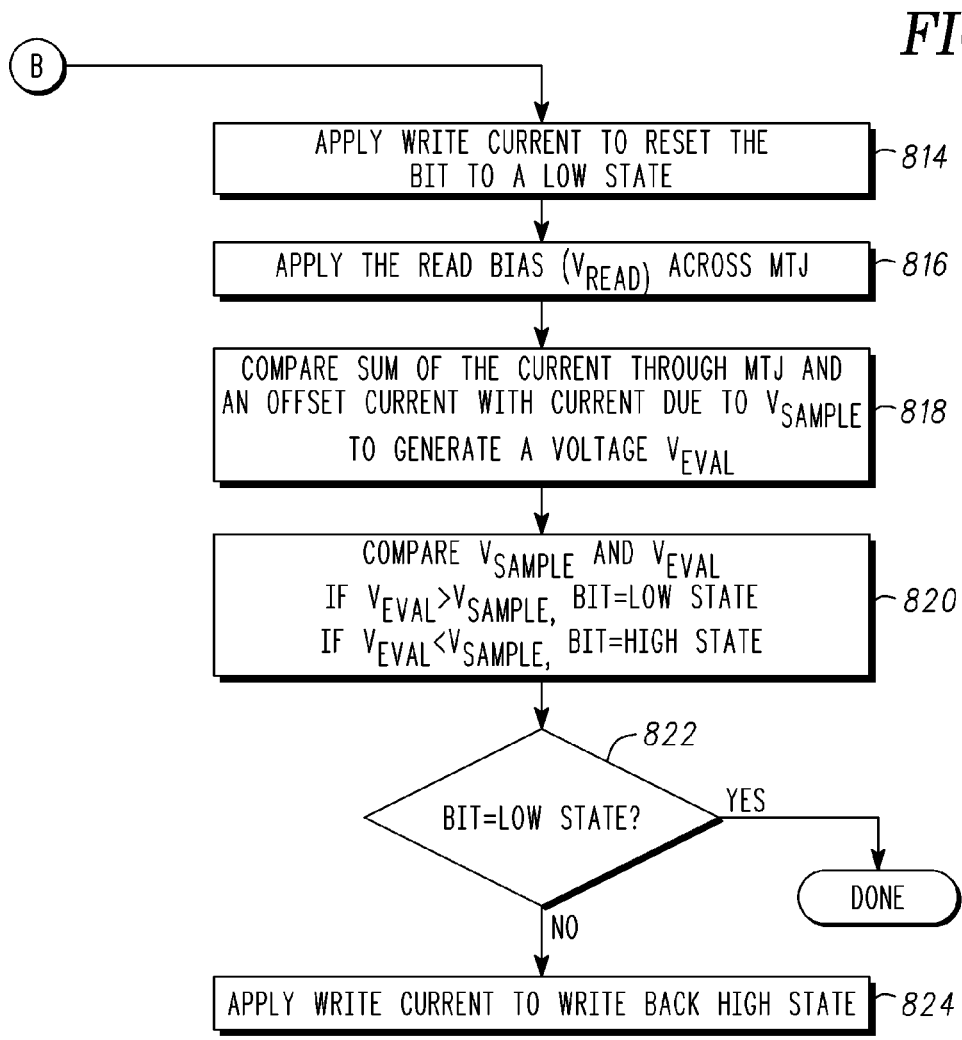
FIG. 8C is a further continuation of the partial flow chart of FIG. 8A.
Figure 9:
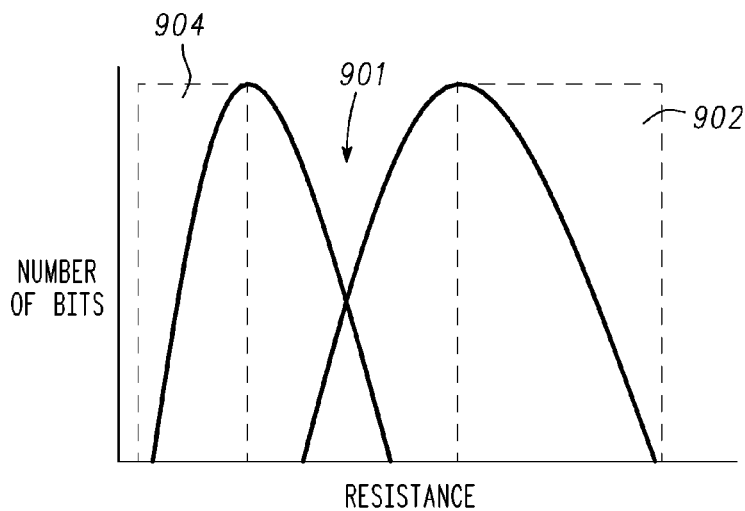
FIG. 9 is a graph of high and low states of the resistance of a number of bits of an array in accordance with the full hybrid read scheme of FIG. 8.

FIG. 9 is a graph of high and low states of the resistance of a number of bits of an array in accordance with the full hybrid read scheme of FIG. 8. The simultaneous read of the bit in step 806 performed with a reference to the average low resistance state (logic "0") bit, successfully reads the bits in region 904. The simultaneous read of the bits in steps 808 performed to the average high resistance state (logic "1") bit successfully reads the bit in region 902. Bits in region 901 produce the output Vout_reflo=1 and Vout_refhi=0 from steps 806 and 808, respectively, and the process proceeds to step 814. The full hybrid read scheme performs two simultaneous referenced read operations to identify the bits that cannot be read successfully by referenced read schemes (bits in region 901) and continues with destructive self-referenced read only with those bits. Thus the destruction phase of the destructive read is conditionally blocked to minimize power. In another embodiment, the two referenced reads can be performed prior to the initiation of the destructive self-referenced read operations. After the referenced reads are complete, the destructive self-referenced read can be initiated to the bits in region 901. Steps 806 and 808 performs referenced reads with a reference to the average low resistance state bit and average high resistance state bit, respectively. In other embodiments, steps 806 and 808 may perform referenced reads with any reference that is programmable by writing to registers. Furthermore, in another embodiment, the destructive self-referenced read in process 800 can be a non-destructive self-referenced read where the non-destructive self-reference read is conditionally performed based on the outcomes of referenced reads.

Figure 10:
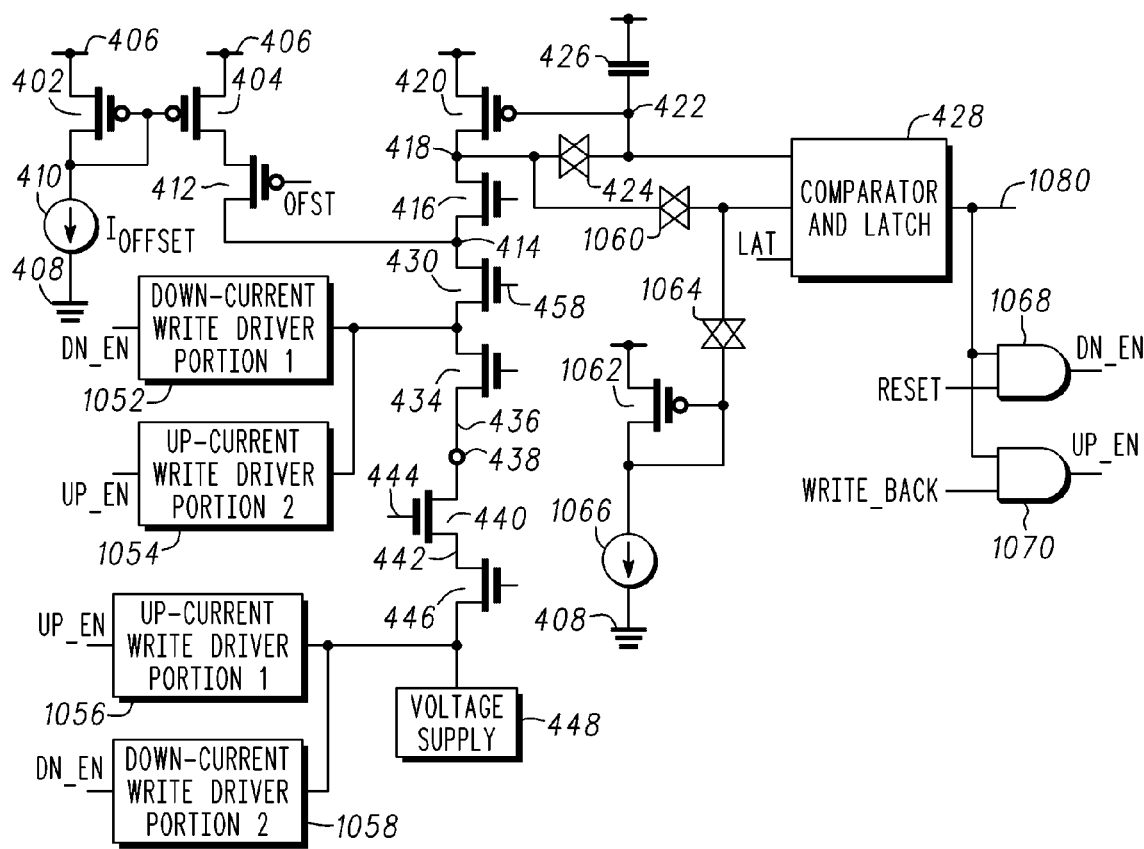
FIG. 10 is a schematic view of a partial hybrid read sense amplifier in accordance with a fifth exemplary embodiment.

FIG. 10 is a schematic view of a partial hybrid read sense amplifier in accordance with a fifth exemplary embodiment wherein like numbers are used to identify like elements of FIG. 4. In the circuit of FIG. 10, current carrying electrodes of transistors 430, 434 are connected to a first down-current write driver (portion 1) 1052 and a second up-current write driver (portion 2) 1054, and a current carrying electrode of transistor 446 is connected to a first up-current write driver (portion 1) 1056 and a second down-current write driver (portion 2) 1058. Additionally, a transmission gate 1060 is coupled between the node 418 and the comparator and latch 428. A transistor 1062 has a first current carrying electrode connected to the first reference voltage 406, and a second current carrying electrode and a control electrode coupled to the comparator and latch 428 by a transmission gate 1064. The second current carrying electrode of transistor 1062 is further coupled to the second voltage source 408 by a current source 1066.

A first AND gate 1068 provides an enable signal to the down-current write driver (portion 1) 1052 and the second down-current write driver (portion 2) 1058 in response to the output from the comparator and latch 428 and a reset signal. A second AND gate 1070 provides an enable signal to the second up-current write driver (portion 2) 1054 and the first up-current write driver (portion 1) 1056 in response to the output from the comparator and latch 428 and a write-back signal.

First down-current write driver (portion 1) 1052 is a circuit that, when enabled by input dn_en, applies a fourth reference voltage at the output node connected to the current carrying electrodes of transistors 430, 434. The first down-current write driver (portion 1) 1052 can be implemented in multiple ways, for example, by using a transistor with one current carrying electrode connected to 406 and another current carrying electrode connected to the output node. Similarly, the first up-current write driver (portion 1) 1056 is a circuit that, when enabled by input up_en, applies a fifth reference voltage at the output node connected to a current carrying electrode of transistor 446. The first up-current write driver (portion 1) 1056 can be implemented in multiple ways, for example, by using a transistor with one current carrying electrode connected to 406 and another current carrying electrode connected to the output node.

Second up-current write driver (portion 2) 1054 is a circuit that, when enabled by input up_en, applies either a sixth reference voltage (lower in magnitude than the fifth reference voltage) or the third reference voltage 448 at the output node connected to the current carrying electrodes of transistors 430, 434. The second up-current write driver (portion 2) 1054 can be implemented in multiple ways, for example, by using a transistor with one current carrying electrode connected to the third reference voltage 448 and another current carrying electrode connected to the output node. Similarly, second down-current write driver (portion 2) 1058 is a circuit that, when enabled by input dn_en, applies a seventh reference voltage at the output node connected to a current carrying electrode of transistor 446. The second down-current write driver (portion 2) 1058 can be implemented in multiple ways, for example, by using a transistor with one current carrying electrode connected to the third reference voltage 448 and another current carrying electrode connected to the output node.

In operation (see FIG. 11), a read bias (Vread) is applied 1102 across the bit 438 by enabling transistors 416, 434, 440, and 446. The transmission gate 424 is enabled, thereby connecting node 422 to node 418. The current through the bit 438 is converted 1104 to a voltage (Vsample) at node 422 by the transistor 420 and stored in the capacitor 426. At the end of step 1104, the transmission gates 424, 1060, and transistor 416 are disabled. A read of the bit is performed 1106 with reference to average low resistance state (logic "0") bit, i.e. Iref=Iref_Rloavg. During 1106, the transmission gate 1064 is enabled and the Comparator and Latch 428 produces an output voltage Vout_reflo at node 1080. If the voltage generated in the read of step 1106 is not equal to one 1108, the bit equals a low state. However, if the voltage is equal to one 1108, a write current is applied 1110 to reset the bit to a low state by the AND gate 1068 asserting dn_en high that further enables down-current write driver portions 1 1052 and 2 1058. A read bias is again applied 1112 across the bit 438 by enabling transistor 416. During this step, the transmission gate 424 is disabled thus disconnecting node 422 from node 418. The switching transistor 412 is enabled thus adding the offset current Ioffset to node 414. An evaluation voltage (Veval) is generated 1114 at node 418 by comparing the sum of current through the bit 438 and the offset current Ioffset, mirrored by the transistors 402 and 404 and supplied to node 414 by the transistor 412, to the current through transistor 420 due to the voltage at node 422. Note that the offset current Ioffset applied through transistor 412 is of opposite polarity to the current through the bit 438 applied through transistor 434 and acts to reduce the current applied through transistor 416. The voltages at nodes 418 and 422 are compared 1116 by the comparator and latch 428 and bit state is determined as shown in step 1116. If the bit is in a high state 1118, a write current is applied 1120 to the bit 438 to write back the high state by asserting a write-back signal and enabling AND gate 1070 that produces up_en high enabling the up-current write driver portions 1 1056 and 2 1054. If the bit is not in a high state 1118, the process 1100 is completed.

Figure 11:
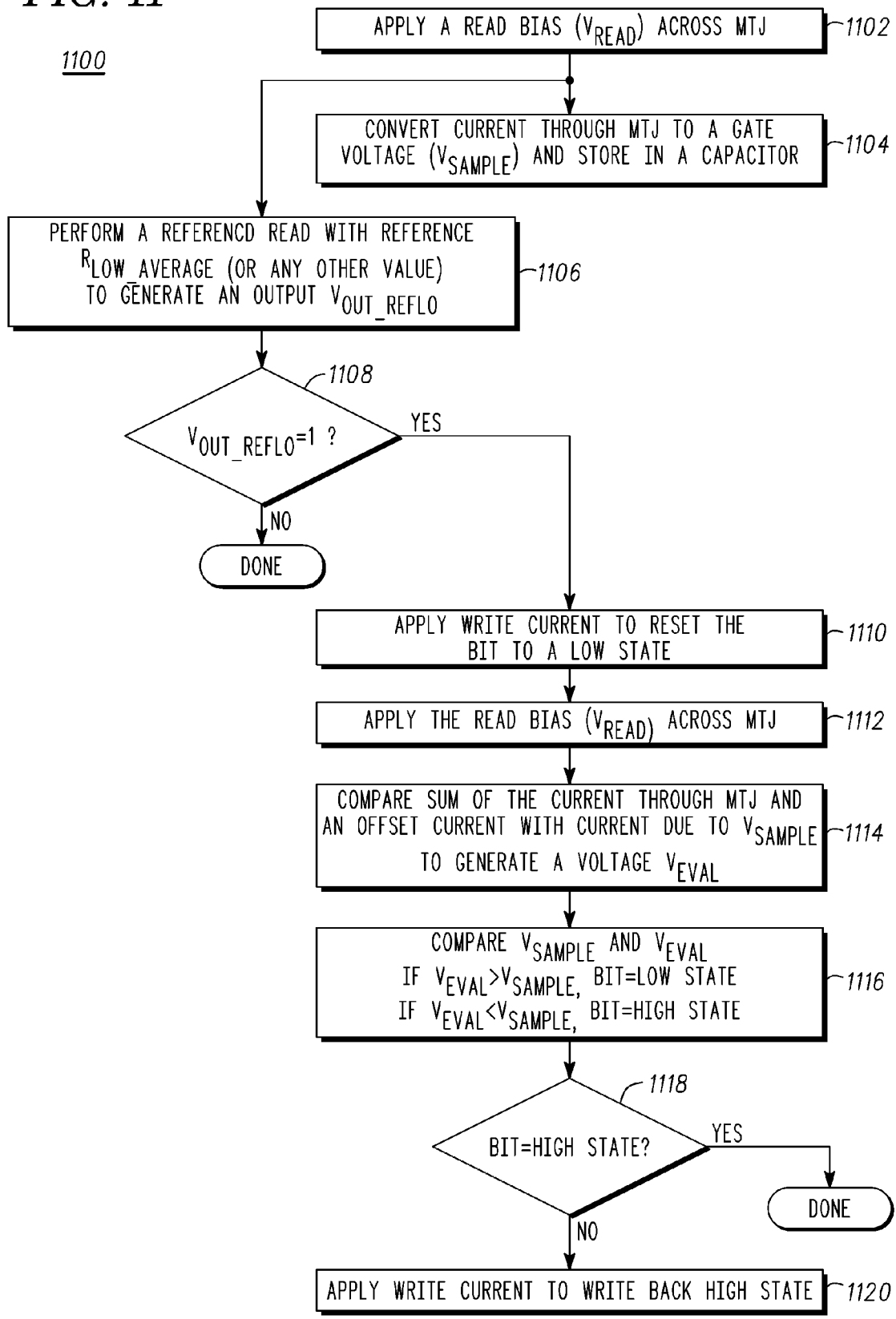
FIG. 11 is a flow chart of a partial hybrid read scheme in accordance with the fifth exemplary embodiment in FIG. 10.
Figure 12:
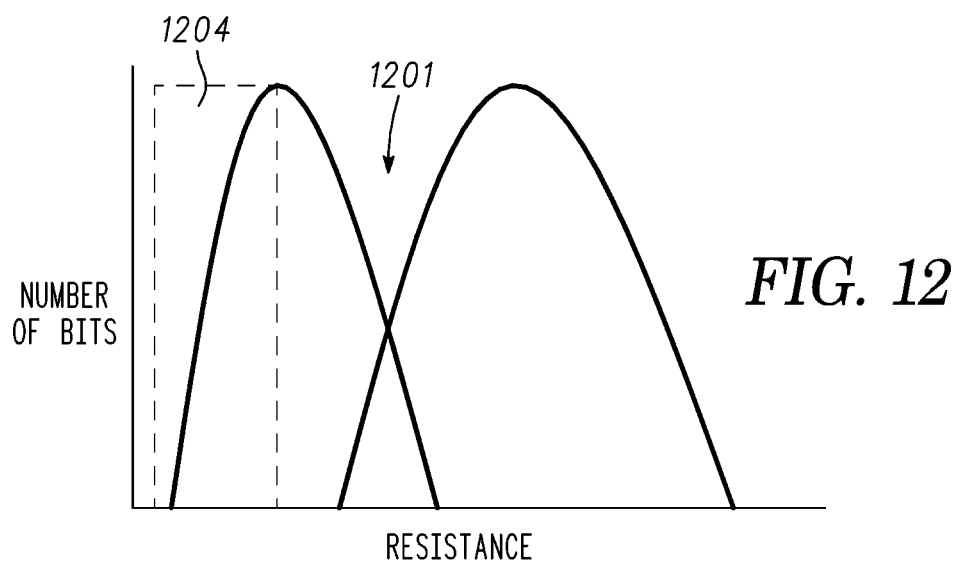
FIG. 12 is a graph of high and low states of the resistance of a number of bits of an array in accordance with the partial hybrid read scheme of FIGS. 10 and 11.

FIG. 12 is a graph of high and low states of the resistance of a number of bits of an array in accordance with the partial hybrid read scheme of FIGS. 10 and 11. The simultaneous read of the bit in step 1106 performed with a reference to the average low resistance state (logic "0") bit, successfully reads the bits in region 1204. Bits in region 1201 produce the output Vout_reflo=1 from step 1106 and the process proceeds to step 1110. The partial hybrid read scheme performs one simultaneous referenced read operation to identify the bits that cannot be read successfully by referenced read scheme (bits in region 1201) and continues with destructive self-referenced read only with those bits. Therefore, the destruction phase of the destructive read is conditionally blocked to minimize power. In another embodiment, the referenced read can be performed prior to the initiation of the destructive referenced read operation. After the referenced read is complete, the destructive self-referenced read can be initiated to the bits in region 1201. Step 1106 performs referenced read with a reference to the average low resistance state bit. In other embodiments, step 1106 may perform referenced read with any reference that is programmable.

While at least one exemplary embodiment has been presented in the foregoing detailed description, it should be appreciated that a vast number of variations exist. Furthermore, the exemplary embodiments may be applied to a memory array comprising any resistive memory elements. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of operation of a spin-torque magnetoresistive memory, the method comprising:
   sampling a bit in the spin-torque magnetoresistive memory to provide a sample;
   comparing the sample with a first reference;
   when comparing the sample with the first reference produces a first output, latching one of a first bit state and a second bit state as a bit state for the bit; and
   when comparing the sample with the first reference produces a second output, performing a self-referenced read operation to determine the bit state for the bit.

2. The method of claim 1, wherein the first reference is a programmable reference.

3. The method of claim 1, wherein sampling the bit further comprises sampling a voltage based on current through the bit to produce a sampled voltage, and wherein comparing the sample with the first reference further comprises comparing the sampled voltage with a first reference voltage.

4. The method of claim 3, wherein sampling the bit further comprises applying a voltage across the bit and converting resulting current through the bit into the sampled voltage.

5. The method of claim 3 further comprising storing the sampled voltage in a capacitor.

6. The method of claim 3, wherein performing the self-referenced read operation for the bit further comprises:
   applying a first write current pulse through the bit to set the bit to the first bit state;
   resampling the bit to generate an evaluation voltage; and
   comparing the evaluation voltage with the sampled voltage to determine the bit state for the bit.

7. The method of claim 6, wherein when comparing the evaluation voltage with the sampled voltage determines that the bit state for the bit is the second bit state, the method further comprises applying a second write current pulse through the bit to set the bit to the second bit state after comparing the evaluation voltage with the sampled voltage.

8. The method of claim 6, wherein resampling the bit includes applying a programmable offset current.

9. The method of claim 3, wherein the first reference voltage is a voltage based on an average high resistance bit in an array of bits in the spin-torque magnetoresistive memory.

10. The method of claim 3, wherein the first reference voltage is a voltage based on an average low resistance bit in an array of bits in the spin-torque magnetoresistive memory.

11. The method of claim 1, wherein performing the self-referenced read further comprises performing a non-destructive self-referenced read.

12. The method of claim 9 further comprises latching one of the first bit state and the second bit state as the bit state for the bit when the sampled voltage is greater than the first reference voltage.

13. The method of claim 10 further comprises latching one of the first bit state and the second bit state as the bit state for the bit when the sampled voltage is less than the first reference voltage.

14. A method of operation of a spin-torque magnetoresistive memory, the method comprising:
sampling a bit in the spin-torque magnetoresistive memory, wherein sampling the bit includes sampling a voltage based on current through the bit to produce a sampled voltage;
comparing the sampled voltage with a first reference voltage;
when the sampled voltage is less than the first reference voltage, determining a first bit state as a bit state for the bit;
comparing the sampled voltage with a second reference voltage;
when the sampled voltage is greater than the second reference voltage, determining a second bit state as the bit state for the bit; and
when the sampled voltage is greater than the first reference voltage and less than the second reference voltage, performing a self-referenced read operation to determine the bit state for the bit.

15. The method of claim 14, wherein at least one of the first and second reference voltages is programmable.

16. The method of claim 14, wherein the first reference voltage is based on an average low resistance bit state, and wherein the second reference voltage is based on an average high resistance bit state.

17. A method of operation of a spin-torque magnetoresistive memory, the method comprising:
sampling a bit in the spin-torque magnetoresistive memory to provide a first sample;
comparing the first sample with a reference;
when comparing the first sample with the reference produces a first output, latching one of a first bit state and a second bit state as a bit state for the bit; and
when comparing the first sample with the reference produces a second output:
applying a first write current pulse through the bit to set the bit to the first bit state;
resampling the bit to provide a second sample; and
comparing the second sample with the first sample to determine the bit state for the bit.

18. The method of claim 17, wherein resampling the bit includes applying a programmable offset current.

19. The method of claim 17, wherein the reference is based on an average low resistance bit in an array of bits or is based on an average high resistance bit in an array of bits.

20. The method of claim 19, wherein the reference is based on the average low resistance bit in the array of bits, and wherein comparing the first sample further comprises:
latching the first bit state as the bit state for the bit when comparing the first sample with the reference produces the first output, wherein the first output indicates the first sample is less than the reference.

* * * * *